United States Patent [19]
Hatakeyama

[11] Patent Number: 5,982,822
[45] Date of Patent: Nov. 9, 1999

[54] VITERBI DECODER

[75] Inventor: Izumi Hatakeyama, Tokyo, Japan

[73] Assignee: Sony Corporation, Tokyo, Japan

[21] Appl. No.: 08/798,548

[22] Filed: Feb. 11, 1997

[30] Foreign Application Priority Data

Feb. 28, 1996 [JP] Japan .................................. 8-041352

[51] Int. Cl.[6] .............................. H03D 1/00; H04L 27/06; G06F 11/10
[52] U.S. Cl. .......................... 375/341; 714/794; 714/795
[58] Field of Search ..................................... 375/341, 340, 375/262; 371/43.7, 43.6, 43.4; 341/107; 714/792, 794, 795

[56] References Cited

U.S. PATENT DOCUMENTS

| | | | |
|---|---|---|---|
| 4,905,317 | 2/1990 | Suzuki et al. | 371/43.7 |
| 5,291,524 | 3/1994 | Itakura et al. | 375/341 |
| 5,710,784 | 1/1998 | Kindred et al. | 371/43.7 |

Primary Examiner—Stephen Chin
Assistant Examiner—Betsy L. Deppe
Attorney, Agent, or Firm—Jay H. Maioli

[57] ABSTRACT

A viterbi decoder that performs viterbi decoding at a high speed with low power consumption using a memory such as a random access memory as a path selection information storage unit. Adder-comparator-selector (ACS) processing units 13a, 13b time-divisionally perform ACS processing for even and odd number states, respectively, based on the branch metrics from a branch metric computing unit 12 and the path metric of the previous period to produce the path selection information. Eight states of the path selection information storage are collected together by a temporary storage circuit 20 and sent to and written in a path selection information storage unit 15. In the path selection information storage unit 15, the past path selection information is read out during the time other than a write time for the path selection information. The path selection information corresponding to the maximum likelihood states of the path selection information in the path selection information storage unit 15 is read out during the time the ACS processing is performed for all states.

6 Claims, 7 Drawing Sheets

VITERBI DECODER

BACKGROUND OF THE INVENTION

1. Field of the Invention

This invention relates to a viterbi decoder used for maximum likelihood decoding of the convolutional code.

2. Description of the Related Art

A viterbi decoder is used in a maximum likelihood decoding method for decoding the convolutional code. Among plural known code sequences, a path closest in the code distance to an input code sequence is selected as being the maximum likelihood path and decoded data is obtained in association with the selected path. Viterbi decoding has a high correction capability against random errors occurring in a call path and gives a particularly high encoding gain in combination with a soft decision demodulation system. For example, in a satellite communication system on which strict limitations are imposed on the electric power in view of adverse effects by interference waves, the convolutional code is used as an error correction code, and a viterbi decoder is used for decoding.

Figure 1:
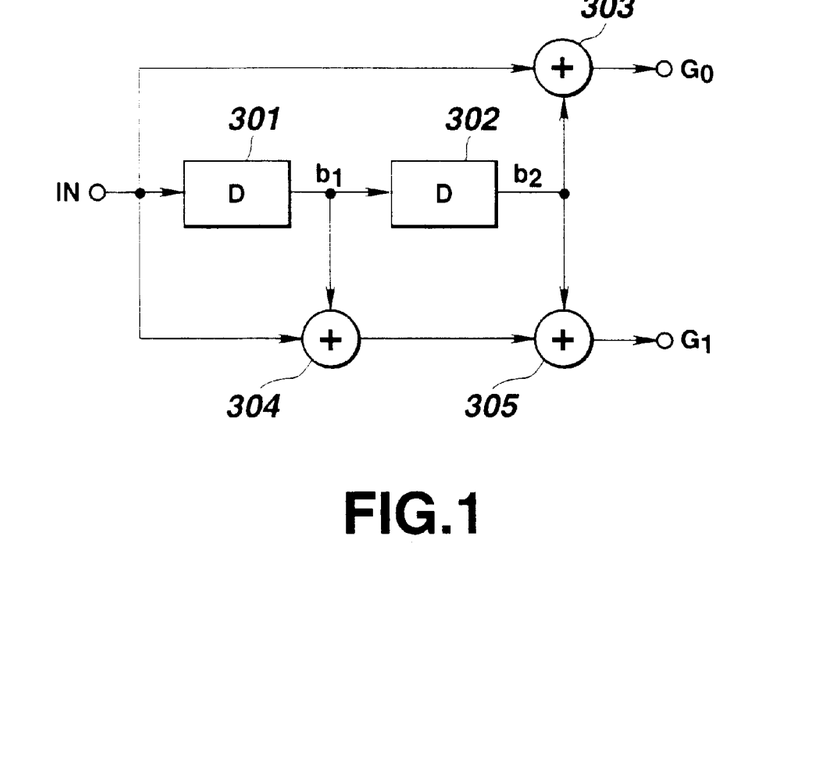
FIG. 1 is a block diagram showing an example of an encoder for a convolutional code.

The viterbi decoding algorithm is briefly explained.

consider the convolutional code with the generating polynominals for which are given by $$G_0(D)=1+D^2$$

$$G_1(D)=1+D+D^2$$

with the code rate R=½ and the constraint length K=3. FIG. 1 shows an illustrative structure generating such code. In this figure, input data is sequentially delayed by delay elements 301, 302, such as two flip-flops 301, 302. The input data is summed by an adder 303 to data from the delay element 302 so as to be taken out as an output $G_0$. Moreover, the input data is summed by adders 304, 305 to data from the delay elements 301, 302 so as to be taken out as an output $G_1$.

If the outputs of the delay elements 301, 302 in the encoder are $b_1$, $b_2$, respectively, four states (00), (01), (10) and (11) are possible as the encoder states ($b_1 b_2$). There are two possible transition states at all times for a given input.

That is, if, for an input 0, the current state is (00) or (10), the state transfers to (00). If the current state is (01) or (11), the state transfers to (10). If, for an input 1, the current state is (00) or (10), the state transfers to (01). If the current state is (01) or (11), the state transfers to (11).

Figure 2:
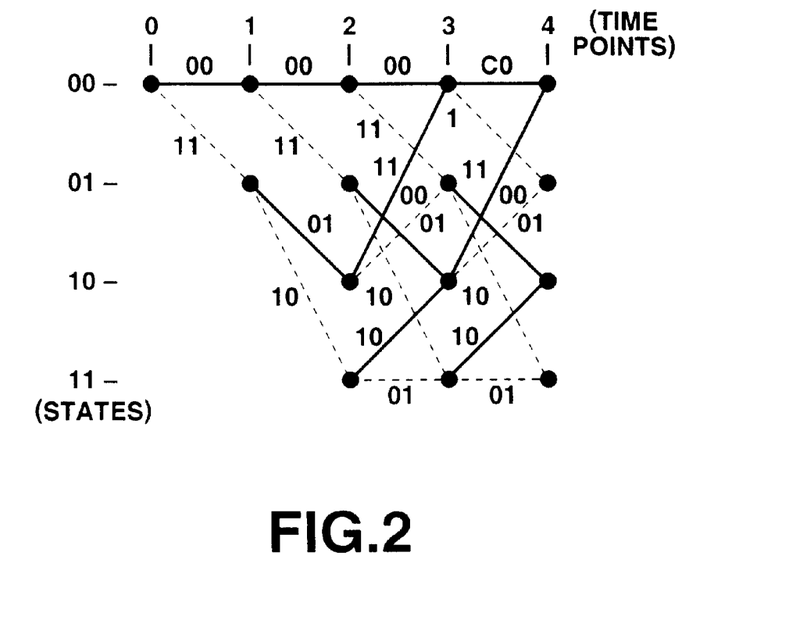
FIG. 2 is a trellis diagram for illustrating the viterbi decoding.

Such state transition is shown as a trellis diagram in FIG. 2, in which a solid-line branch indicates transition for an 0 input, while a broken-line branch indicates transition for an input 1. The numerals entered along the branches denote the code ($G_0$ $G_1$) of FIG. 1 outputted on occurrence of the branch transition.

As apparent from FIG. 2, two paths become confluent at the time of transition to respective states. Of the two paths to the respective states in the viterbi decoding algorithm the maximum likelihood path (most probable path) is selected, and the path which has survived is selected up to a pre-set length. The most probable ones of the paths selected in the respective states are detected for decoding the reception code.

The viterbi decoder, which decodes the convolutional code based on the above-described viterbi algorithm, is basically made up of a branch metric computing unit for computing the metric between the reception data sequence (reception sequence) and the respective branches, an ACS (adder, comparator, selector) computing means for selecting the surviving path and for computing the path metric of the surviving path, a path metric storage unit for storing the values of the path metrics in the respective states, a path memory for storing the output of the selected path and a maximum likelihood decision unit for detecting the address of the most probable path metric for controlling the path memory.

In the ACS computing unit, the surviving path in each state is selected in accordance with a so-called path metric transition diagram, and the path metric of the surviving path is computed. This path metric transition diagram is formulated on the basis of the trellis diagram shown in FIG. 2

Figure 3A:
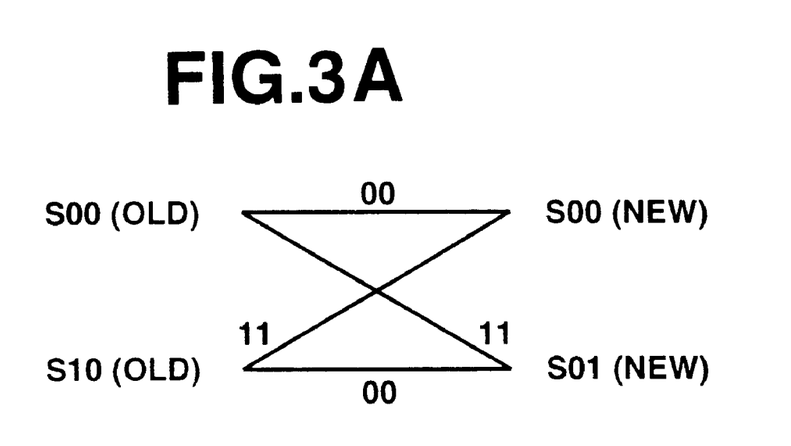
FIG. 3 illustrates path metric transition for illustrating viterbi decoding.
Figure 3B:
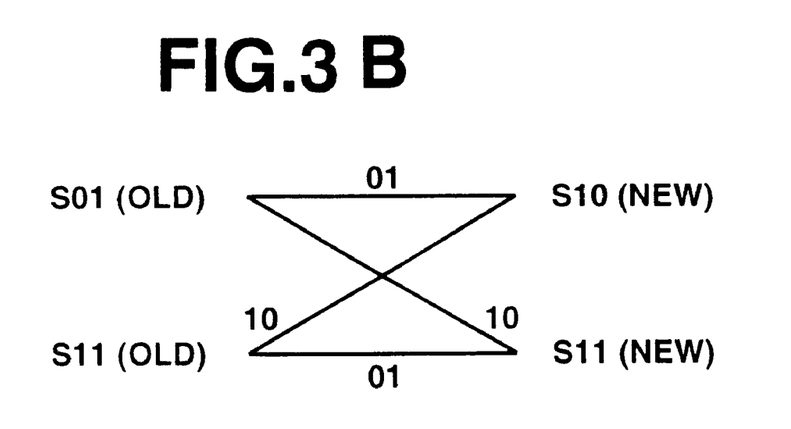

If the code shown by the trellis diagram of FIG. 2 is used, the path metric transition diagram is as shown in FIGS. 3A and 3B. That is, in the trellis diagram shown in FIG. 2, two paths, namely a path in which a code (00) is outputted from the state (00), and a path in which a code (11) is produced from the state (10), become confluent in the state (00). Therefore, the path metric S00(new) of the current state (00) is $$S00(new)a=S00(old)+BM00$$

or $$S00(new)b=S10(old)+BM11$$

if the value of the state of the previous time point (path metric) is denoted as S00(old), S10(old) and the branch metric is denoted by BM00 and BM11. That is, a path with a smaller one of the two path metrics S00(new)a and S00(new)b being currently calculated is selected and the value of the selected path (path metric) is outputted as the path metric S00(new) of the current state (00). The path selection information at this time is outputted simultaneously.

On the other hand, a path producing a code (11) from the state (00) and a path producing a code (00) from the state (10), totaling two paths, are confluent at the state (01). Therefore, the current path metric S01 (new) is $$S01(new)a=S00(old)+BM11$$

or $$S01(new)b=S10(old)+BM00$$

Also, a path producing a code (01) from the state (01) and a path producing a code (10) from the state (11), totaling two paths, are confluent at the state (10). Therefore, the current path metric S10(new) is $$S10(new)a=S01(old)+BM01$$

or $$S10(new)b=S11(old)+BM10$$

In addition, a path producing a code (10) from the state (01) and a path producing a code (01) from the state (11), totaling two paths, are confluent at the state (11). Therefore, the current path metric S11(new) is $$S11(new)a=S01(old)+BM10$$

or $$S11(new)b=S11(old)+BM01$$

On the basis of the foregoing, a path metric transition diagram shown in FIGS. 3A and 3B is prepared.

In a conventional viterbi decoder, it is known to perform ACS calculations by time divisional processing and to use a random access memory (RAM) as a path selection information memory designed to store the path selection information obtained from the result of ACS calculations. In such viterbi decoder, the path selection information obtained by the ACS processing is simply written in the RAM each time the information corresponding to the number of bits per each address of the RAM is available. After all ACS processing comes to a close and the path selection information is written in the RAM, the past path selection information is sequentially read out for a maximum likelihood decision and the decoding result is estimated and prepared.

In this case, since the past path selection information is read out after writing all of the path selection information into the RAM as a result of the ACS computing by time divisional processing, the processing time for writing is separate from that for readout, with the result that the processing time becomes longer than in the path selection information storage circuit employing flip-flops or the like, and hence the high-speed viterbi decoding cannot be realized. Moreover, in the case of the path selection information storage circuit employing flip-flops, since the contents of all states are accessed when reading out the path selection information for making a maximum likelihood decision, low power consumption cannot be achieved easily.

SUMMARY OF THE INVENTION

It is therefore an object of the present invention to provide a viterbi decoder in which the write/readout processing of the past path selection information can be improved in efficiency for lowering the power consumption and expediting the viterbi decoding, although a usual memory such as RAM is used as a path selection information memory.

According to the present invention, ACS processing for viterbi decoding is performed time-divisionally and the path selection information from the ACS processing means is grouped in terms of n states as a unit for storage in path selection information storage means. The past path selection information for the maximum likelihood decision is read out at a time other than the write time of the n states of the path selection information in the path selection information storage means during ACS processing.

It is preferred that the path selection information obtained from the ACS processing is temporarily stored in the temporary storage means so that the n states of the path selection information will be collected and sent to the path selection information storage means.

According to the present invention, the number of times of memory accessing is required for each processing of the ACS processing operations can be reduced for expediting viterbi decoding. In addition, since the path selection information is written in terms of n states as a unit, the number of bits pre address of the memory can be set to n, such that it is unnecessary to read out the path selection information of all states at the time of reading out the path selection information to contribute to a low power consumption.

DESCRIPTION OF THE PREFERRED EMBODIMENTS

Referring to the drawings, preferred embodiments of the present invention will be explained in detail.

Figure 4:
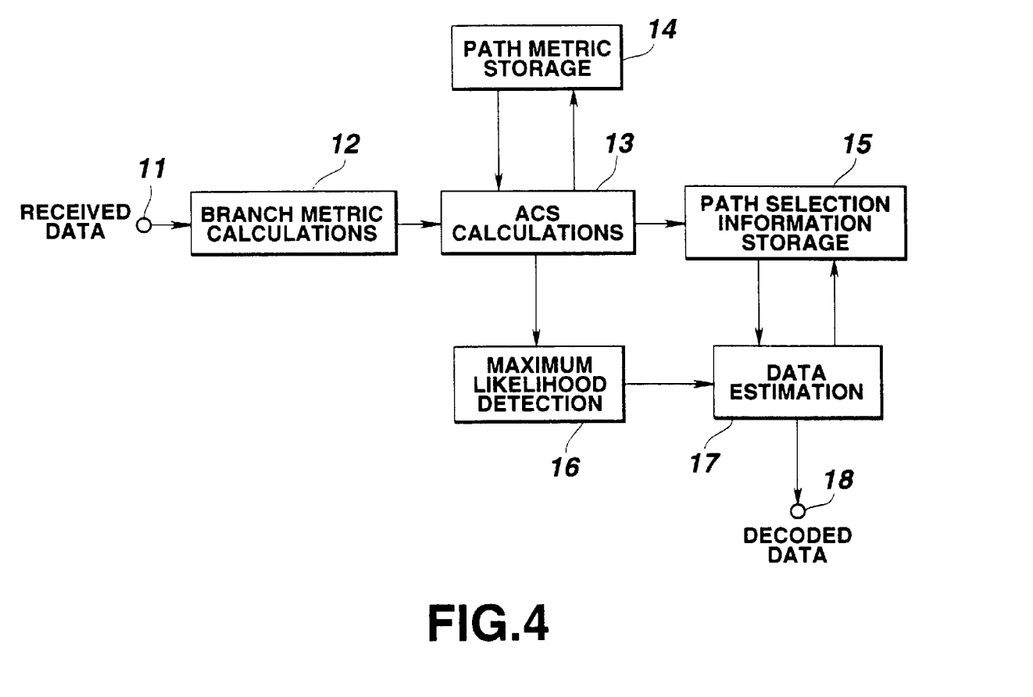
FIG. 4 is a schematic block diagram showing the structure of a viterbi decoder embodying the present invention.

FIG. 4 shows, in a schematic block diagram, the structure of a viterbi decoder embodying the present invention.

In general, a viterbi decoder exploits the viterbi algorithm in such a manner that the most probable path of two paths in each state is selected, the surviving path is selected up to a pre-set length and the most probable path selected in each state is detected for decoding the reception code.

Referring to FIG. 4, a viterbi decoder calculating the convolutional code based on such a viterbi algorithm basically includes a branch metric computing unit 12 for computing the metric between a reception data sequence (reception sequence) from a terminal 11 and each branch, and an adder-comparator-separator (ACS) processing unit 13 for selecting the surviving path for computing the path metric of the surviving path. The viterbi decoder also includes a path metric storage unit 14 for storing the value of the path metric in each state, and a path selection information storage unit 15 for storing an output of the path as the selection information of the selected path. The viterbi decoder further includes a maximum likelihood detection unit 16 for detecting the state which has been the maximum likelihood path metric value at each time point, and a data estimation unit 17 for performing data estimation using the state information and the past path selection information read out from the path selection information storage unit 15 and for outputting the decoded data at a terminal 18.

By way of a specific example, the convolutional encoding/viterbi decoding with a constraint length K=9 and the code rate R=½ is explained. The number of states for the constraint length K is $2^{K-1}$, so that, for K=9, the number of states is $2^8$=256 states. These 256 states are represented by hexadecimal notation 00 to FF. The path metric S, which is a value of the state xx, is represented by Sxx. The path metric for a new state is represented by Sxx(new), while that for a directly previous time point is represented as Sxx(old).

In ACS processing for the constraint length K=9 and the code rate R=½, the process of selecting the maximum likelihood path from among two paths undergoing transition to respective states is carried out. For example, there are two paths for transition to a new state 00(new) are two paths, namely the paths from the directly previous time points 00(old) and 80(old). For transition to the state 00(new) from the states of the directly previous time points 00(old) and 80(old), the input codes need to be (00) and (11), respectively. In this consideration, the metrics of the respective input code patterns (branch metrics) are found from the input code (modulated data) and the path likelihood is found in combination with the metric of the directly previous time points (path metric) in order to select the surviving path and to store the path metric for the next time point.

If the branch metric for the input code pattern ($G_0\ G_1$) is represented as $BM(G_0\ G_1)$, the calculations at this time become $$S00(\text{new})a = S00(\text{old}) + BM(00)$$

$$S00(\text{new})b = S80(\text{old}) + BM(11)$$

if $(S00(\text{new})a < S00(\text{new})b)$ $$S00(\text{new}) = S00(\text{new})a$$

else $$S00(\text{new}) = S00(\text{new})b$$

Either S00(new)a or S00(new)b whichever has been selected represents the path selection information. This calculation is carried out for 256 states of from S00 to SFF for each time pont.

According to the present invention, the ACS processing in the ACS processing unit 13 is carried out by time divisional processing. Regarding the path selection information storage unit 15 for storing the path selection information obtained by the ACS processing, a random access memory (RAM) of n bits per each address, configured for storing the n-state path selection information as one storage unit, is used, so that the path selection information prepared by time-divisional ACS processing is written every n states in the RAM. The selection information of the past paths, used for trace-back of paths for the maximum likelihood decision, is read out in the course of the n-state ACS processing during the time other than the write time from the RAM operating as the path selection information storage unit 15.

Figure 5:
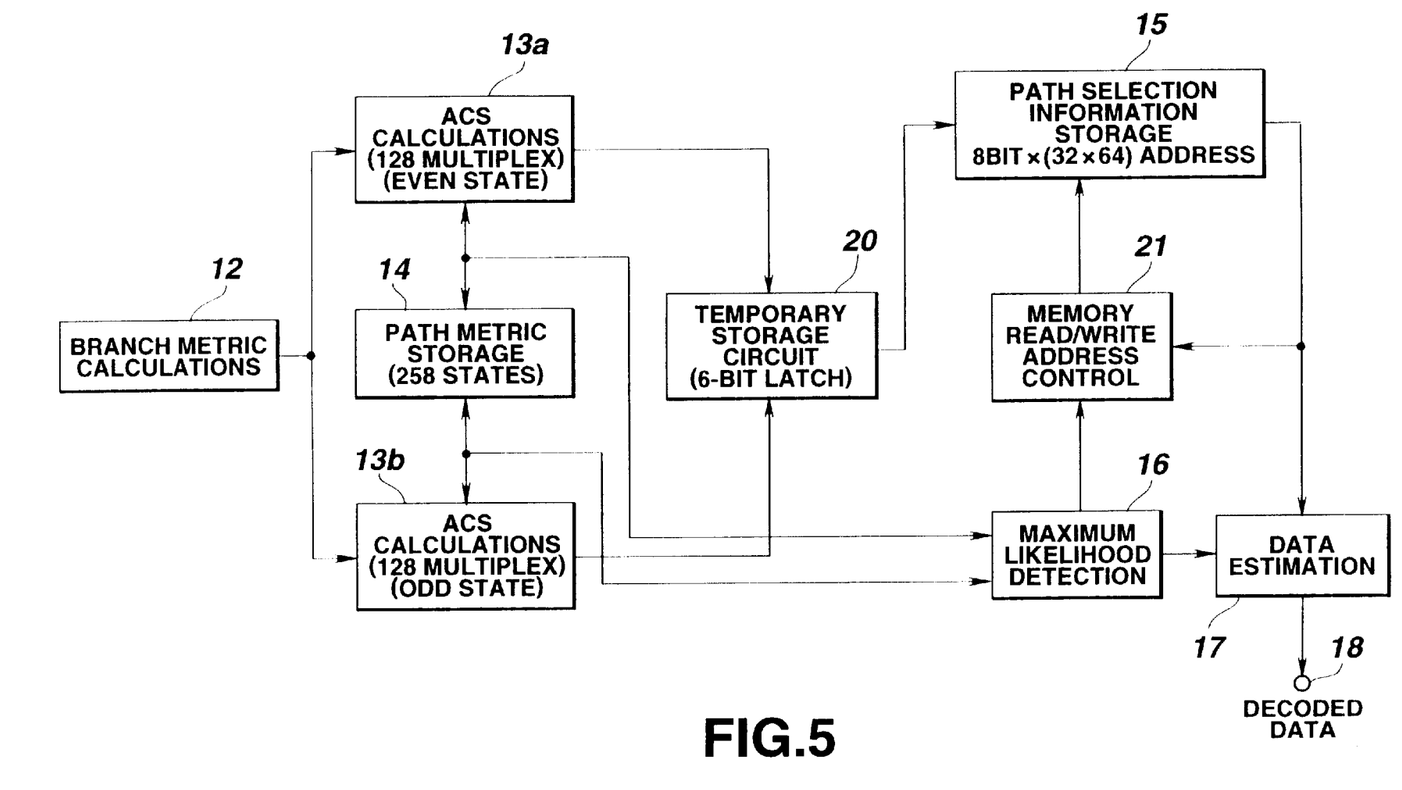
FIG. 5 is a block diagram showing an example of an illustrative structure of a path metric memory of the viterbi decoder of FIG. 4 and its vicinity.

Specifically, the above-mentioned 256-state ACS processing is carried out by two ACS processing circuits 13*a*, 13*b*, as shown for example in FIG. 5. The path selection information obtained by this ACS processing is sent to a temporary storage circuit 20 for temporary storage therein. The n-state path selection information, such as 8-state path selection information, is collected and sent to the path selection information storage unit 15 for writing therein. On the other hand, the past path selection information is read out from the path selection information storage unit 15 at a processing timing other than the write timing so that writing and readout occur alternately.

Referring to FIG. 5, the branch metrics BM00, BM01, BM10 or BM11, prepared in the branch metric processing unit 12 each time the code ($G_0\ G_1$) of the above-mentioned demodulated data is entered at a pre-set period T, are supplied to ACS processing circuits 13*a*, 13*b*. Of these ACS processing circuits, the processing circuit 13*a* performs calculations of even-numbered 128 state path metrics (S00, S02, . . . , SFE) among the 256-state ACS processing operations, while the processing circuit 13*b* performs calculations of odd-numbered 128 state path metrics (S01, S03, . . . , SFF). For this ACS processing, the calculations are carried out every T/128 by the above-mentioned 128 time divisional multiplexing, so that path metrics previous to the current period by one period (1 T) are sequentially read from the path metric memory 14 so as to be written in the path selection information storage unit 15 via a temporary storage circuit 20, at the same time as a new path metric is written in the path metric memory 14.

The ACS processing circuits 13*a*, 13*b* send new path metrics, prepared by each processing operation, to the maximum likelihood detection unit 16. The ACS processing circuits 13*a*, 13*b* detect the maximum likelihood state at a time point when the ACS processing for all states has come to a close, and prepares the initial address value for the path selection information storage unit 15 for selecting the past path selection information used for performing data estimation. A memory readout-write address controller 21 inputs the above-mentioned initial address value for preparing the address of the path selection information storage unit 15. The path selection information previous to the current period by one period is read out from the path selection information storage unit 15 during the residual time other than the write time, such as, for example, three out of every four processing operations, so as to be sent to the memory readout write address controller 21, for preparing the address of the path selection information for one period before. The path selection information storage unit 15 is configured for storing for example, 64 periods (64T) of the path selection information. This path selection information from the path selection information storage unit 15 is sent to the data estimation unit 17. The data estimation unit 17 performs data estimation, using the past path selection information and the output of the maximum likelihood detection unit 16 to output decoded data at a terminal 18.

Referring to FIGS. 6A to 6J, the readout/write operation is hereinafter explained.

Figure 6A:
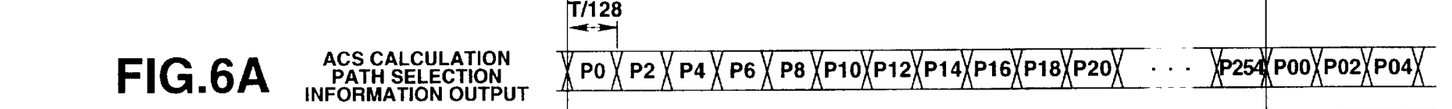
FIG. 6 is a timing chart for illustrating the ACS processing and the accessing operation to the path selection information storage unit.
Figures 6B, 6C:
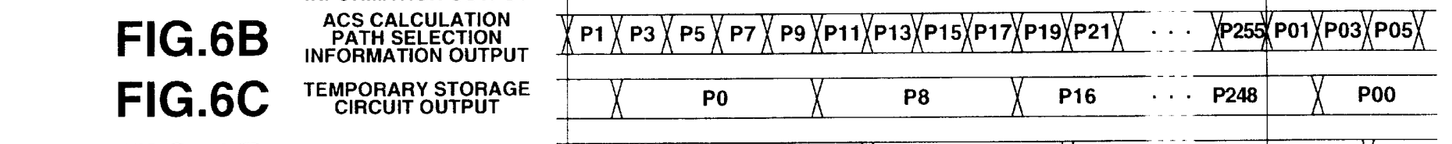

In FIGS. 6A to 6B, the period T of the processing for 256 states of the ACS processing is the updating period for decoded data. This period T is time-divisionally multiplexed by 128 so that the processing is carried out by the ACS processing units 13*a*, 13*b*. That is, FIG. 6A shows the output of path selection information data P0, P2, . . . , P254 of the even number states from the ACS processing unit 13*a*, while FIG. 6B shows the output of path selection information data P1, P3, . . . , P255 of the odd number states from the ACS processing unit 13*b*. These ACS processing operations are carried out for each time slot T/128 obtained by dividing the period by 128 for outputting new path selection information data. The path selection information data P0 to P255 are each the 1-bit information for selecting the maximum likelihood one of two paths in each state, such that 256 bit path selection information data for 256 states are obtained during one period T.

Figures 6D, 6E:
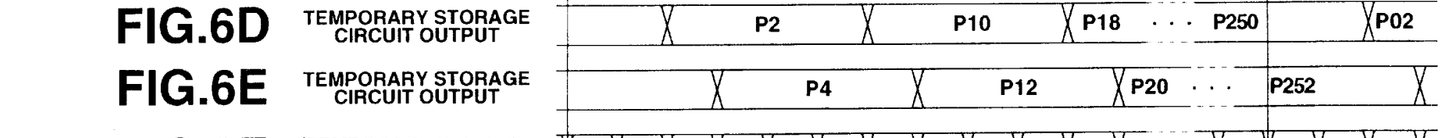
Figure 6F:
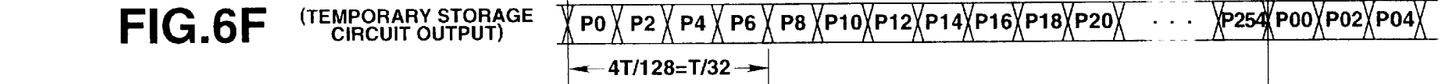
Figure 6G:
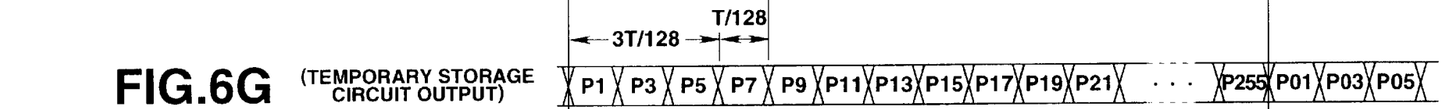
Figure 6H:
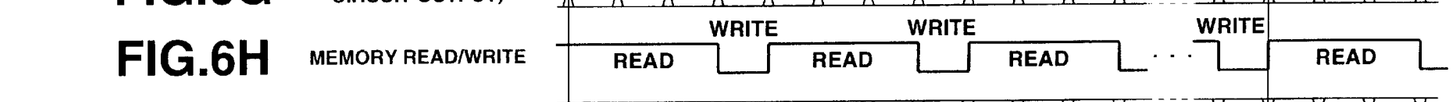

The temporary storage circuit 20 collects four slots (4T/128=T/32) of the path selection information data obtained from each of the ACS processing units 13*a*, 13*b* in each time slot of T/128 and sends the path selection information data to the path selection information storage unit 15, with the sum total of 8 bits of the path selection information for the 8 states as a unit. That is, FIG. 6C shows an output obtained on seizing and holding the path selection information data of the first one of the four time slots (such as P0) from the even number state ACS processing circuit 13*a*. Similarly, FIGS. 6D and 6E show a temporarily held output of the selection information data of the second one of the four time slots (such as P2) and a temporarily held output of the selection information data of the third one of the four time slots (such as P4), respectively. FIGS. 6F and 6G show the path selection information output per se of FIGS. 6A and 6B respectively. FIG. 6H shows that the four slot path selection information data from the even number state ACS processing circuit 13*a*, such as P0, P2, P4 and P6, become available in association with the writing in the selection information storage unit 15 at the fourth slot of the four slots at the write timing of the fourth slot. The above holds for the path selection information data from the odd number state ACS processing circuit 13*b* (FIG. 6B). That is, the path selection information data for four slots are collected together at the write timing in the path selection information storage unit 15 and combined with the data of the four slots of the even numbered states so that eight bits for eight states of the path selection information data are written in the path selection information storage unit 15 as a storage unit. Meanwhile, since the path selection information outputs of the ACS processing circuits 13a, 13b can be directly used for the path selection information data of every fourth slot, as shown in FIGS. 6F and 6G, the temporary storage circuit 20 can be configured as a 6-bit latch circuit.

The path selection information storage unit 15 is a RAM having a storage capacity capable of storing 64 periods, each period T including 256 (=8×32) states, with each address being 8 bits (1 byte). That is, the path selection information storage unit 15 has a storage capacity of 8 bits×(32×64) addresses which equals 2048 bytes (2K bytes).

The readout from the path selection information storage unit 15 may be done during the time other than the above-mentioned write time, that is during three out of the four slots (3T/128), as shown in FIG. 6H. Specifically, the memory readout/write address controller 21 forms a read-out address RA for the path selection information storage unit 15, based on the maximum likelihood state as detected by the maximum likelihood detection circuit 16, and reads out the path selection information of the maximum likelihood state for the period previous to the current period by one period from the path selection information storage unit 15. While the maximum likelihood state path selection information is one bit, the memory readout/write address controller 21 reads out the path selection information P(1) of eight bits (eight states) of the same address containing this one bit. Based on the 1 bit of the maximum likelihood state in the simultaneously read eight-bit path selection information P(1), the memory readout/write address controller 21 forms an address for reading out eight bits of the path selection information of the maximum likelihood state for one period before. The above sequence of operations is repeated until the path selection information up to the period previous to the current period by 64 periods is read out. The data estimation unit 17 then estimates data. The decoded data is outputted at the terminal 18.

Figures 6I, 6J:
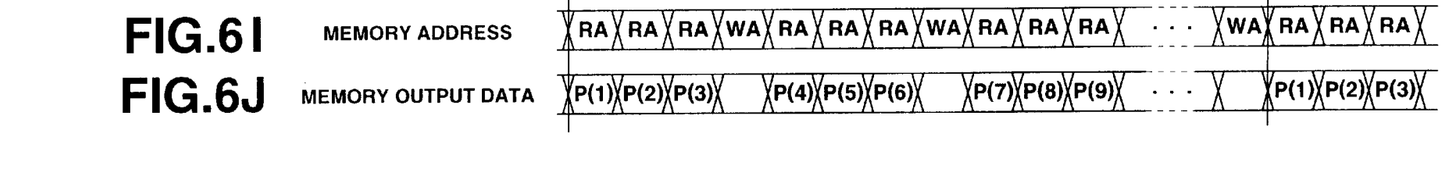

FIG. 6I shows the timing of generation of the readout address RA and the write address WA by the memory readout/write address controller 21. FIG. 6J shows the past path selection information as read out from the path selection information storage unit 15 by P(i), where P(i) represents 8-bit data of the same address containing 1 bit of the past maximum likelihood state path selection information for the period previous to the current period by one period.

In the above-described illustrative embodiment, each period T is divided into 128 time slots by the above-described ACS processing of 128 time divisional multiplexing and even number state and odd number state ACS processing operations are carried out for each time slot. The path selection information is written in one of the four time slots outputting the path selection information of eight states, while the past path selection information is read out during the remaining three slots. Since the address is constructed and written in the selection of the read-out path selection information in terms of eight bits as an information unit every eight states, it suffices to read out and select the path selection information of eight bits, which account for ⅟₃₂ of the total states, in reading out the path selection information in each past period in the above-described illustrative embodiment. However, since the path selection information storage unit 15 has the capacity of storing the past 64 periods (64T) of the path selection information, 32 of the 128 time slots for one period T are used for writing the path selection information while the 64 slots are used for reading out the past 64 time periods. By alternately reading out and writing the information during one period T, the operation of writing the path selection information of 256 states and reading out the path selection information of past 64 periods can be performed in one period T. The result is that the power consumption may be reduced without lowering the operating speed of viterbi decoding, although a memory such as RAM is used as the path selection information storage unit 15.

In the above-described embodiment, 32 slots of 128 time slots, obtained by dividing one period T by 128, are used for writing the path selection information, while 64 slots are used for reading out the past 64 time periods. However, the storage capacity for the past path selection information can be increased such that the past 96 periods can be used for path tracing.

Figure 7:
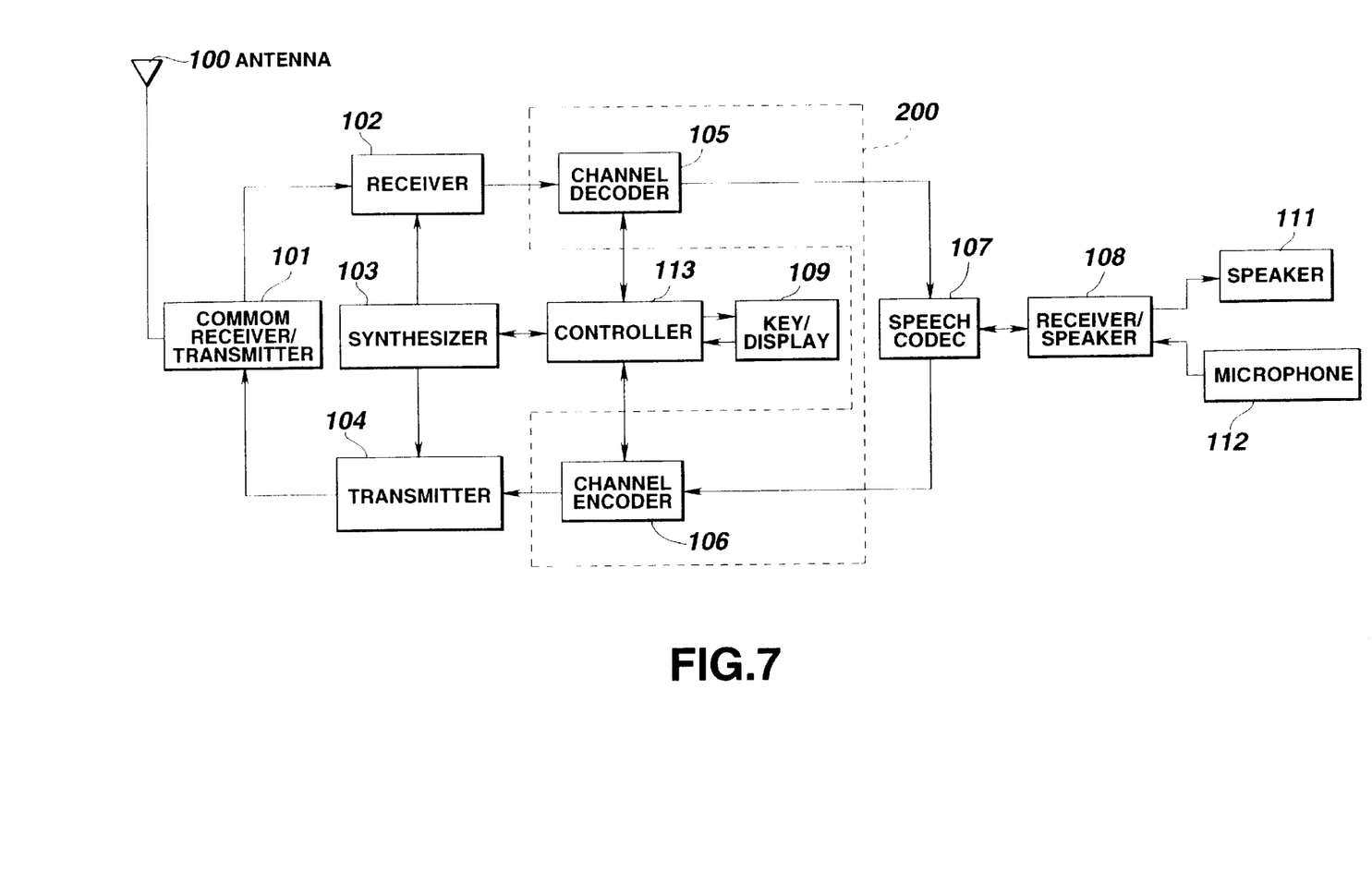
FIG. 7 is a schematic block diagram showing the structure of a digital mobile communication unit.
Figure 8:
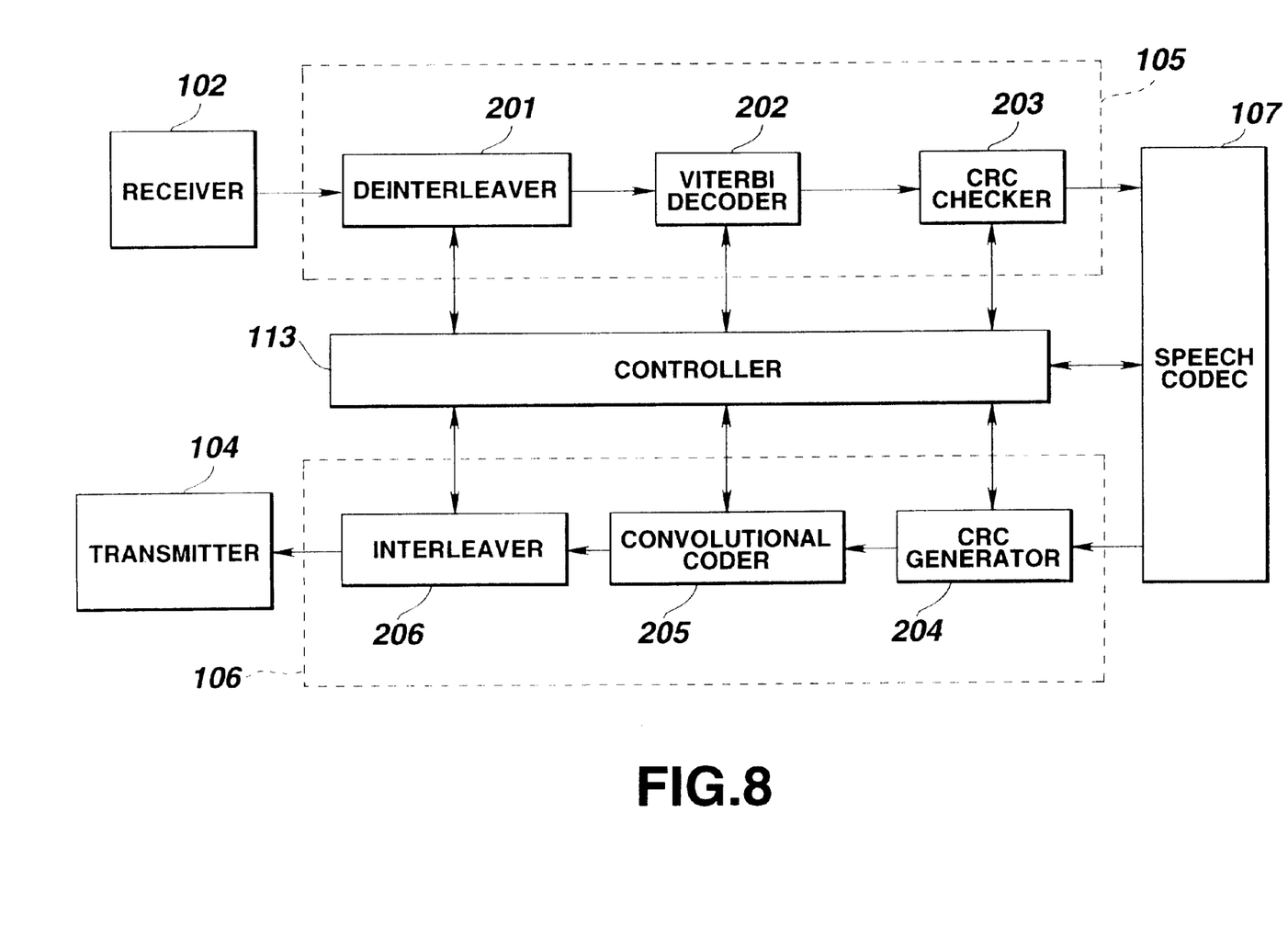
FIG. 8 is a block diagram showing an illustrative structure of a channel codec employing the viterbi decoder and its vicinity.

Referring to FIGS. 7 and 8, an illustrative device employing the above-described viterbi decoder is now explained.

FIG. 7 shows a terminal of a digital mobile communication device having a channel codec (coder/decoder) for performing error correction using the viterbi decoder according to the present invention. FIG. 8 shows a channel codec of FIG. 7 and associated components.

The terminal of the digital mobile communication device shown in FIG. 7 receives or transmits carrier signals from or to a base station by an antenna 100. In addition, the terminal of the digital mobile communication device demodulates or modulates received or transmitted carrier signals via a common receiver/transmitter 101 by a receiver 102 and by a transmitter 104, respectively. The terminal also includes a synthesizer 103 controlling the transmission/reception frequency of the receiver 102 and the transmitter 104.

An output signal of the receiver 102 is sent to a channel decoder 105. This channel decoder 105 includes a viterbi decoder 202 and performs format conversion and decoding of the speech information and the communication control information. The speech data from the channel decoder 105 is sent to a speech codec 107. The speech codec 107 encodes/decodes the speech. The speech data is sent to a channel decoder 106 for performing format conversion and encoding of the speech information and the communication control information. The channel decoder 105 and the channel encoder 106 make up a so-called channel codec 200.

To the speech codec 107 is connected a receiver/speaker 108 which performs interface conversion with a speaker 111 and a microphone 112 for realizing speech in a call.

The controller 113 forms and decodes the control information, while setting, canceling or maintaining a call and performing I/O control of, for example, a key/display 109. The controller 113 also controls a synthesizer 103 by controlling the reception/transmission frequency.

In FIG. 8, the speech data from the speech codec 107 or the control information from the controller 113 is sent to a CRC generator 204 of the channel encoder 106 for appendage of the CRC, while being sent to a convolutional encoder 205 for error correction encoding. The resulting data is interleaved by an interleaver 206 by way of pre-processing for modulation and then sent to the transmitter 104.

The reception data outputted by the receiver 102 is deinterleaved by the deinterleaver 201 of the channel decoder 105 and then sent to the viterbi decoder 202 for error correction. The resulting data is sent to a CRC checker 203 for checking the errata of data. The speech data from the CRC checker 203 is sent to the speech codec 107, while the control data is set to the controller 113.

The present invention is not limited to the above-described embodiments. For example, the number of multiplexing for time divisional multiplexing may be set to an optional value. The number of bits of the temporary storage circuit or the number of path selection information data to be stored per address of the memory of the path selection information storage unit can be set to an optional value. In addition, the constraint length of the code or the encoding ratio can also be set to optional values. Moreover, the present invention may be applied to a variety of equipments utilizing a viterbi decoder, in addition to the digital mobile communication device having a channel codec.

What is claimed is:

1. A viterbi decoder comprising:

branch metric computing means for computing branch metrics based on an input code supplied at a pre-set period;

adder-comparator-selector computing means for computing path selection information and path metrics of respective states based on a path metric of a period that is one period previous to a current period and the branch metrics from said branch metric computing means;

temporary storage means for temporarily storing the path selection information from said adder-comparator-selector computing means n states at a time; and path selection information storage means for storing the path selection information read out from said temporary storage means, wherein the n states of the path selection information are read out at a time for supply to said path selection information storage means, and past path selection information for determining a maximum likelihood decision is read out from said path selection information storage means during a time other than a write time of the path selection information to said path selection information storage means.

2. The viterbi decoder as set forth in claim 1, further comprising a path metric memory for storing a path metric and which is updated with the path metric computed by said adder-comparator-selector computing means.

3. The viterbi decoder as set forth in claim 1, wherein said adder-comparator-selector computing means includes a plurality of time-divisionally operated adder-comparator-selector computing means, each of said adder-comparator-selector computing means for computing the path selection information and the path metric of each state based on a corresponding one of the branch metrics from said branch metric computing means.

4. The viterbi decoder as set forth in claim 1, wherein said temporary storage means includes a plurality of latch circuits.

5. The viterbi decoder as set forth in claim 1, wherein said path selection information storage means comprises a random access memory for storing n bits in each address of said random access memory.

6. The viterbi decoder as set forth in claim 1, further comprising a data estimation unit for estimating decoding data based on data read out from said path selection information storage means and for outputting the estimated decoding data.

* * * * *